(12) United States Patent
Kim et al.

(10) Patent No.: US 7,017,088 B2
(45) Date of Patent: Mar. 21, 2006

(54) GRAPHICAL SYSTEM AND AUTOMATED PATTERN GENERATOR FOR TESTING ARRAYS

(75) Inventors: Hong S. Kim, Milpitas, CA (US); Kuan-yu J. Lin, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 429 days.

(21) Appl. No.: 09/949,349

(22) Filed: Sep. 7, 2001

(65) Prior Publication Data

US 2003/0051196 A1    Mar. 13, 2003

(51) Int. Cl.
*G11C 29/00* (2006.01)
(52) U.S. Cl. .................................... 714/718
(58) Field of Classification Search ............. 714/718, 714/720, 719, 738, 739
See application file for complete search history.

(56) References Cited

U.S. PATENT DOCUMENTS 5,644,581 A * 7/1997 Wu .............................. 714/738
6,601,205 B1 * 7/2003 Lehmann et al. ........... 714/741

* cited by examiner

*Primary Examiner*—Albert Decady
*Assistant Examiner*—James C. Kerveros
(74) *Attorney, Agent, or Firm*—Osha Liang LLP

(57) ABSTRACT

A method of generating a test vector pattern for an array, including determining a failure of a test of the array, defining a type of test vector pattern to generate using a graphical user interface, generating the test vector pattern, and testing the array using the test vector pattern. A test vector pattern generation tool, including an array, a test vector pattern, and a graphical user interface generating the test vector pattern. The array is tested using the custom test vector pattern.

20 Claims, 8 Drawing Sheets

```
#!/usr/dist/share/tk,v8.0/5.x-sun4/bin/wish
!/usr/dist/share/tk,v8.0/5.x-sun4/bin/tcl source pins.tcl source print.tcl
source file.tcl
source vector.tcl set cpu "./r_l2tc_testchip.v"

GetDevPinList $cpu
set vf [open "vector.tdl" w]
set inpins [GetAllDevInputPins]
source totdl.tcl puts $vf "INCLUDE \"jp_header_testchip.tdl\" "
set ways 3
set cols 7
set rows 255 source tchip_proc.tcl

SetPinOrder
ResetCycles
source manpat.tcl set cols_even [list 0 2 4 6]
set cols_odd [list 1 3 5 7]

proc Write1 { way e_or_o l_or_r } { global rows cols mem vf global cols_even cols_odd
    set data LLLLLLLLLLLLLLLLLLLLLLLLLLLLLLLL
    set data HHHHHHHHHHHHHHHHHHHHHHHHHHHHHHHH
    for { set j 0} {$j<=$rows} {incr j} {
        foreach i $cols_even { puts $vf "(*write way=$way $e_or_o $l_or_r row=$j col=$i *)"
            WriteCycle $way $e_or_o $l_or_r $i $j $data
            set mem($way,$e_or_o,$l_or_r,$i,$j) $data
        }
        foreach i $cols_odd { puts $vf "(*write way=$way $e_or_o $l_or_r row=$j col=$i *)"
            WriteCycle $way $e_or_o $l_or_r $i $j $data
            set mem($way,$e_or_o,$l_or_r,$i,$j) $data
        }
```

GRAPHICAL SYSTEM AND AUTOMATED PATTERN GENERATOR FOR TESTING ARRAYS

BACKGROUND OF THE INVENTION

A typical modern computer system includes a microprocessor, memory, and peripheral computer resources, i.e., monitor, keyboard, software programs, etc. The microprocessor has, among other components, arithmetic, logic, and control circuitry that interpret and execute instructions from a computer program. FIG. 1 shows a prior art diagram of an example of a computer's microprocessor (20) that has a central processing unit ("CPU" and also known as "execution unit") (22), a memory controller (24) (also known as a "load/store unit"), and on-board cache memory (26). The microprocessor (20) is connected to external cache memory (28), and the microprocessor (20) is also connected to the main memory (30) of the computer system. Cache memory is a region of fast memory that holds copies of data.

One goal of the computer system is to execute instructions provided by the computer's users and software programs. The execution of instructions is carried out by the CPU (22). Data needed by the CPU (22) to carry out an instruction are fetched by the memory controller (24) and loaded into the internal registers (32) of the CPU (22). Upon command from the CPU (22), the CPU (22) searches for the requested data in the internal registers (32). If the requested data is not available in the internal registers (32), the memory controller (24) searches for requested data first in the on-board cache memory (26), then in the external cache memory (28). If those searches turn out unsuccessful, then the memory controller (24) retrieves the data from the main memory (30).

Register files and the main memory are generally arranged in one or more memory arrays. FIG. 2 shows a portion of a typical memory array in which memory cells (40) are arranged in rows (44) and columns (46) such that data in each memory cell can be accessed by the selection of one or more bit lines (42) that are used to read data from the memory array or write data to the memory array.

The process of production testing of arrays (e.g., memory arrays) is generally performed by test engineers. Test vector patterns are generated to test cells within an array. The goal of a test engineer is to create test vector patterns to provide as much coverage as possible by physically accessing cells to validate the memory cell is functioning properly. Referring to FIG. 3, the process of creating test vectors starts when the test engineer receives a design document of an array from a designer of the array (Step 50). The design document is a written description depicting the array including the size of the array, a bitmap program (actual physical memory cell locations and data), etc. Next, the test engineer uses the design document to create a bitmap program (i.e., translation of virtual address to a physical memory location) of the array (Step 52) in a form that a test vector pattern generator can recognize. During the testing process, many types of test vector patterns are generated to uncover various bugs in the design of the cells. The test engineer defines a plurality of test vector patterns (6n, 12n, walking 1's, etc.) to uncover the various bugs in the design (Step 54).

Once the test vector patterns are defined, source code is written to generate the desired test vector patterns (Step 56). The test pattern vector generated from the source code is raw data made up of a plurality of zeros and ones. Depending on the type of tester machine being used, the raw data is formatted to fit that particular tester machine (Step 58). The formatted raw data is then fed into the tester machine where the tester machine has physical interface with the silicon chip (Step 60). The resulting output of the tester machine is compared to a set of expected results to determine if the array is functioning properly (Step 62). This process is re-created and performed for each test vector pattern needed to test a particular array.

BRIEF DESCRIPTION OF DRAWINGS

FIG. 7 illustrates a portion of sample code generated by the test vector pattern generator in accordance with one or more embodiments of the present invention.

SUMMARY OF INVENTION

Figure 1:
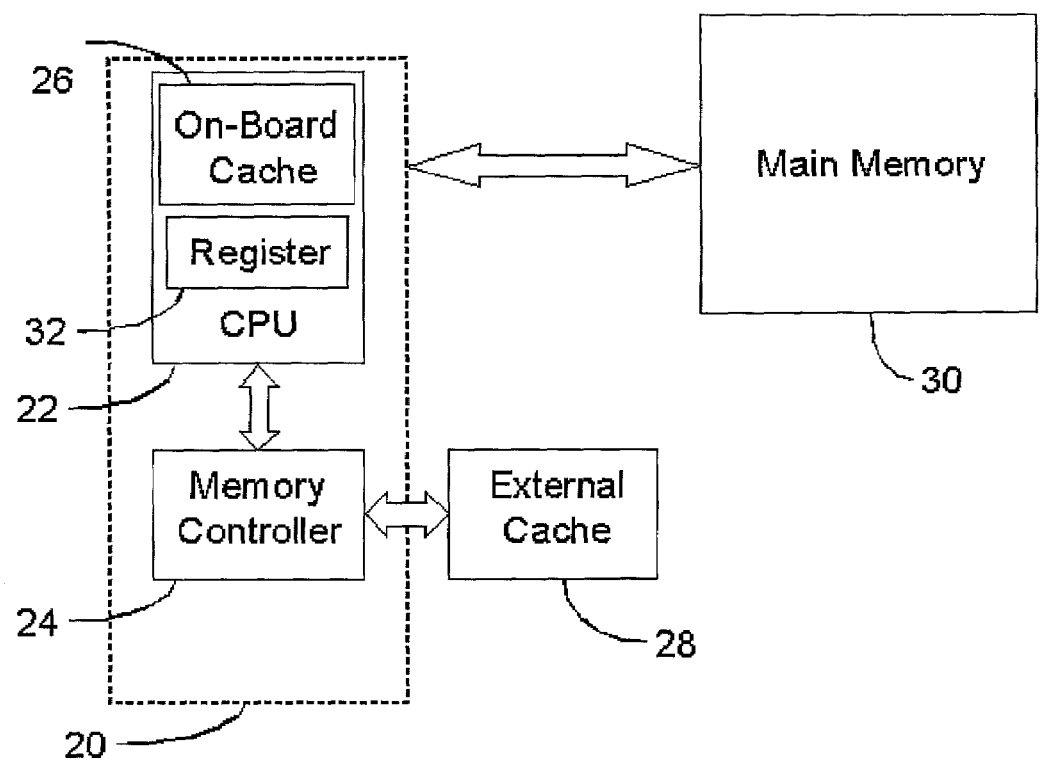
FIG. 1 illustrates a block diagram of a microprocessor and memory of a typical computer system.
Figure 2:
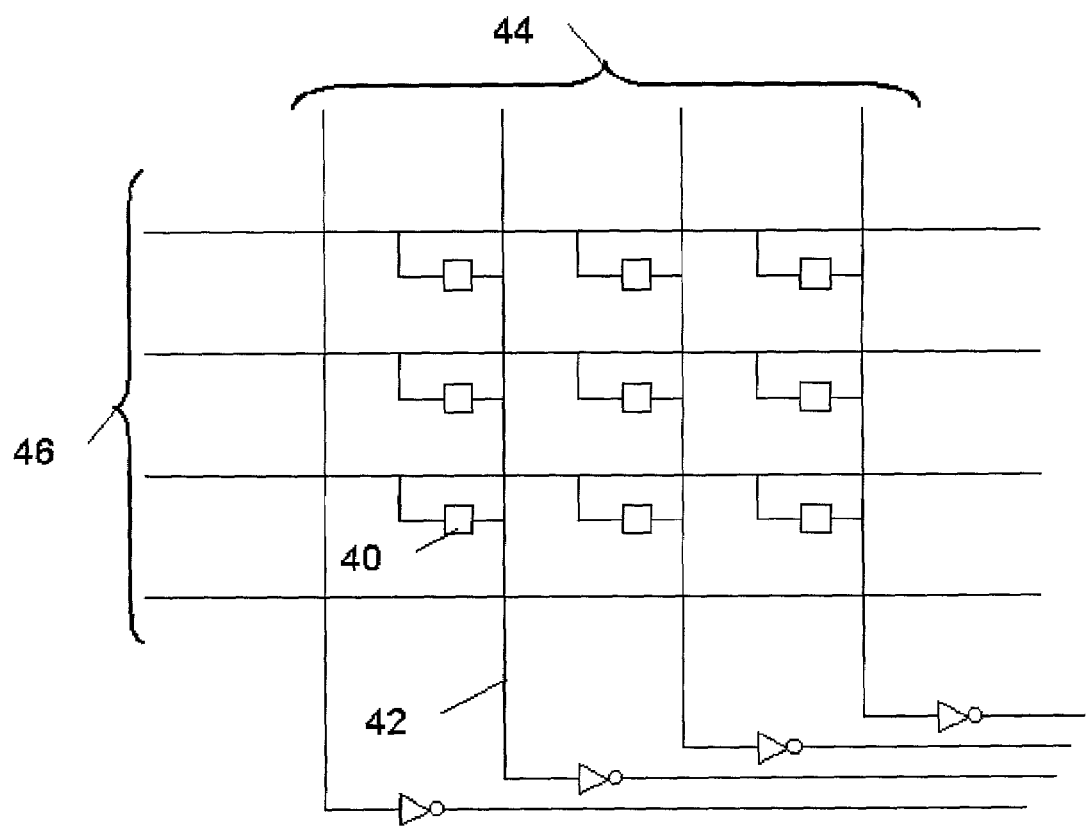
FIG. 2 illustrates a schematic diagram of a portion of a typical memory array.

In general, in one aspect, a method of generating a test vector pattern for an array, comprising determining a failure of a test of the array, defining a type of test vector pattern to generate using a graphical user interface, generating the test vector pattern, and testing the array using the test vector pattern.

In general, in one aspect, a test vector pattern generation tool, comprising an array, a test vector pattern, and a graphical user interface generating the test vector pattern. The array is tested using the custom test vector pattern.

In general, in one aspect, a computer system to generate a custom test vector pattern for an array, comprising a processor, a memory, a computer display, and software instructions stored in memory. The software instructions enable the computer system under control of the processor, to perform determining a failure of a test of the array, defining a type of custom test vector pattern to generate, generating the custom test vector pattern using a graphical user interface displayed on the computer display, testing the array using the custom test vector pattern, and performing write operations and read operations.

In general, in one aspect, a test vector pattern generation tool, comprising means for determining a failure of a test of the array, means for defining a type of custom test vector pattern to generate, means for generating the custom test vector pattern, means for testing the array using the custom test vector pattern, means for performing write operations and read operations, and means for generating the custom test vector pattern using a graphical user interface.

Other aspects and advantages of the invention will be apparent from the following description and the appended claims.

DETAILED DESCRIPTION

Specific embodiments of the invention will now be described in detail with reference to the accompanying figures. Like elements in the various figures are denoted by like reference numerals for consistency.

Figure 4:
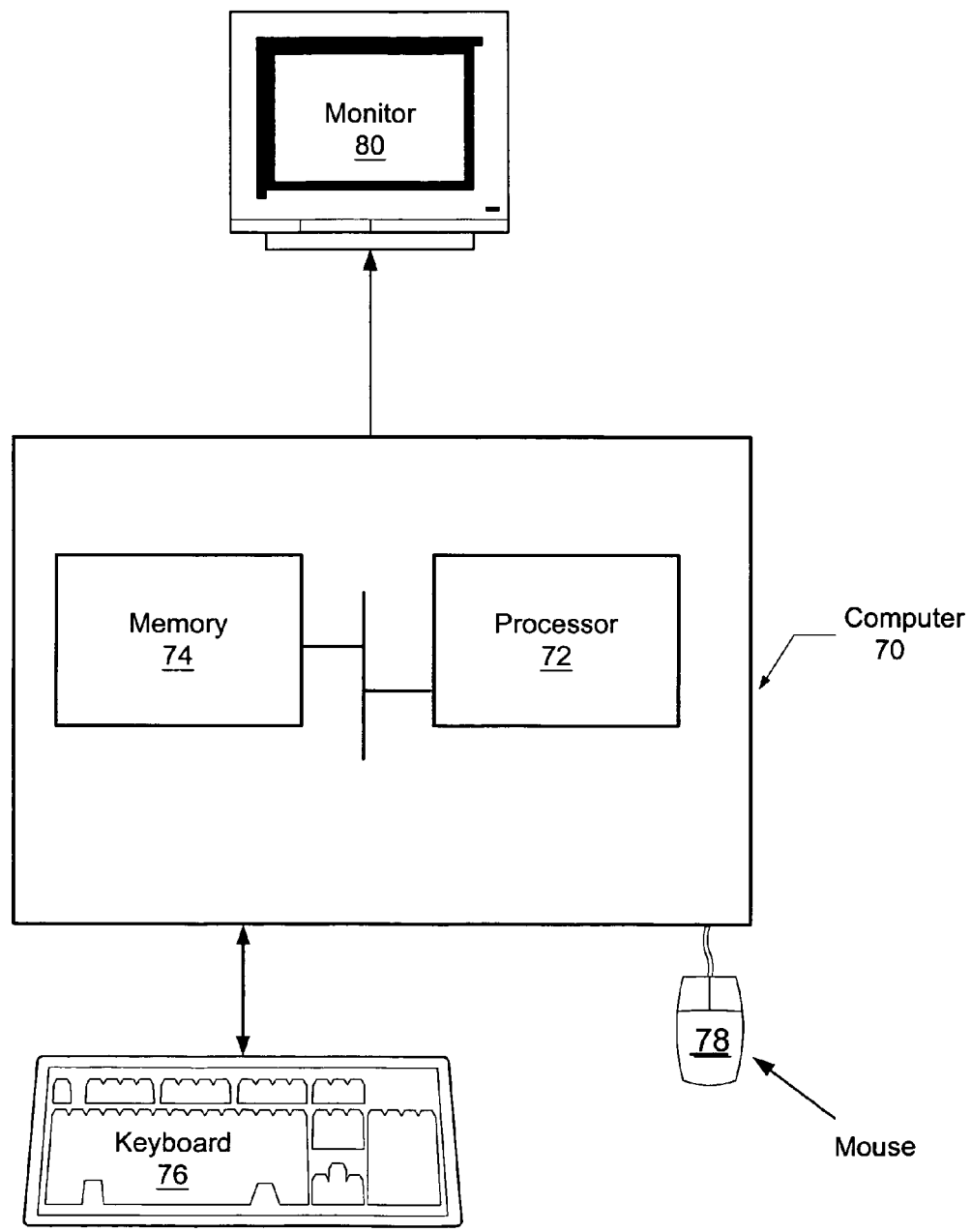
FIG. 4 illustrates a block diagram of a typical computer system.

The invention described here may be implemented on virtually any type computer regardless of the platform being used. For example, as shown in FIG. 4, a typical computer (70) has a processor (72), associated memory (74), and numerous other elements and functionalities typical to today's computers (not shown). The computer (70) has associated therewith input means such as a keyboard (76) and a mouse (78), although in a given accessible environment these input means may take other forms. The computer (70) is also associated with an output device such as a display (80), which also may take a different form in a given accessible environment.

Figure 3:
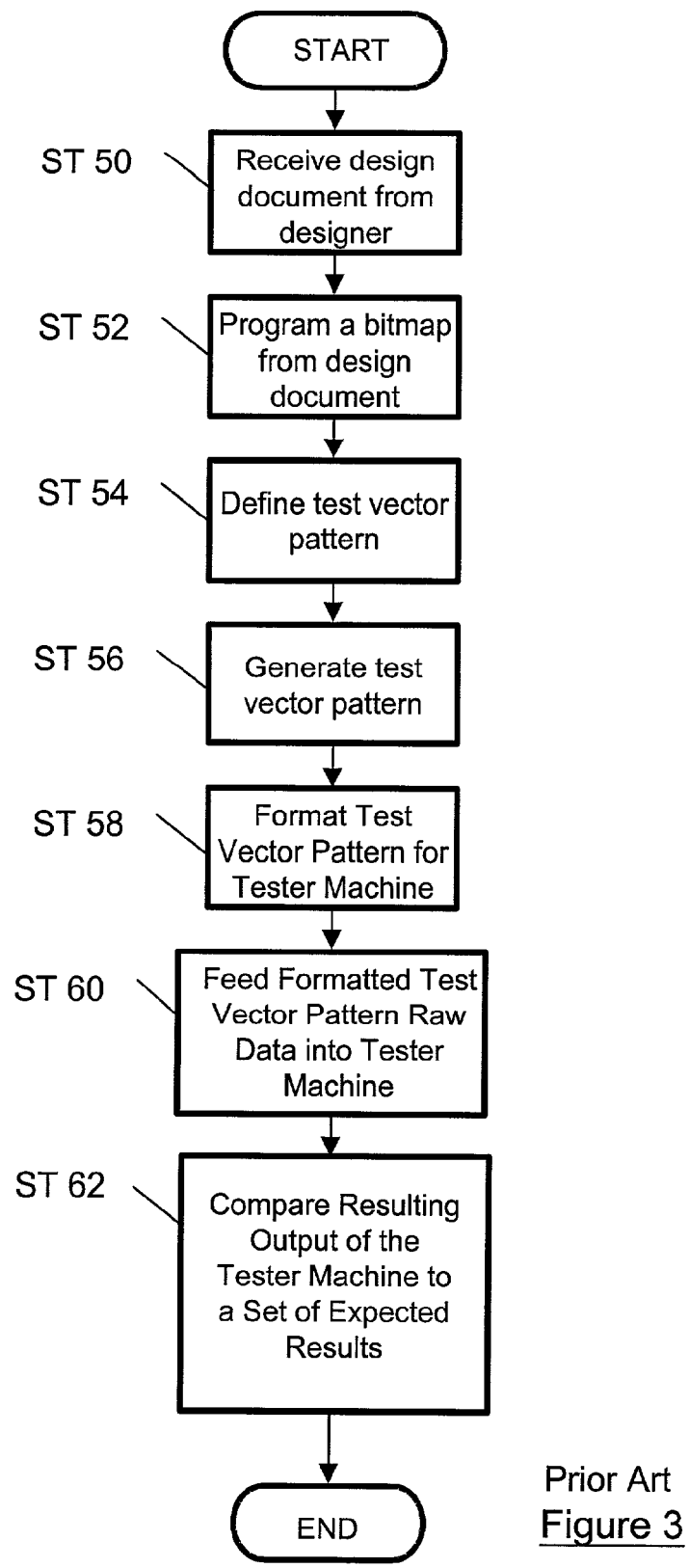
FIG. 3 illustrates a flowchart of a typical method of production testing of arrays.

The present invention generates random and custom test vector patterns designed to test arrays, including memory arrays containing memory cells. As described in FIG. 3 above, generating test pattern vectors (Step 56) is part of the array testing process for the test engineer. This step is especially time consuming to test engineers because source code is required to be generated for each different test pattern vector. In one or more embodiments of the present invention, the test engineer generates source code for the test vector pattern using a graphical user interface. Using the graphical user interface, an array with rows and columns of cells is displayed on a computer display. An input means such as a mouse highlights specific cells to graphically designate a test vector pattern. From this graphical display of the test vector pattern, source code is generated. In one embodiment of the present invention, the source code is generated automatically.

Figure 5:
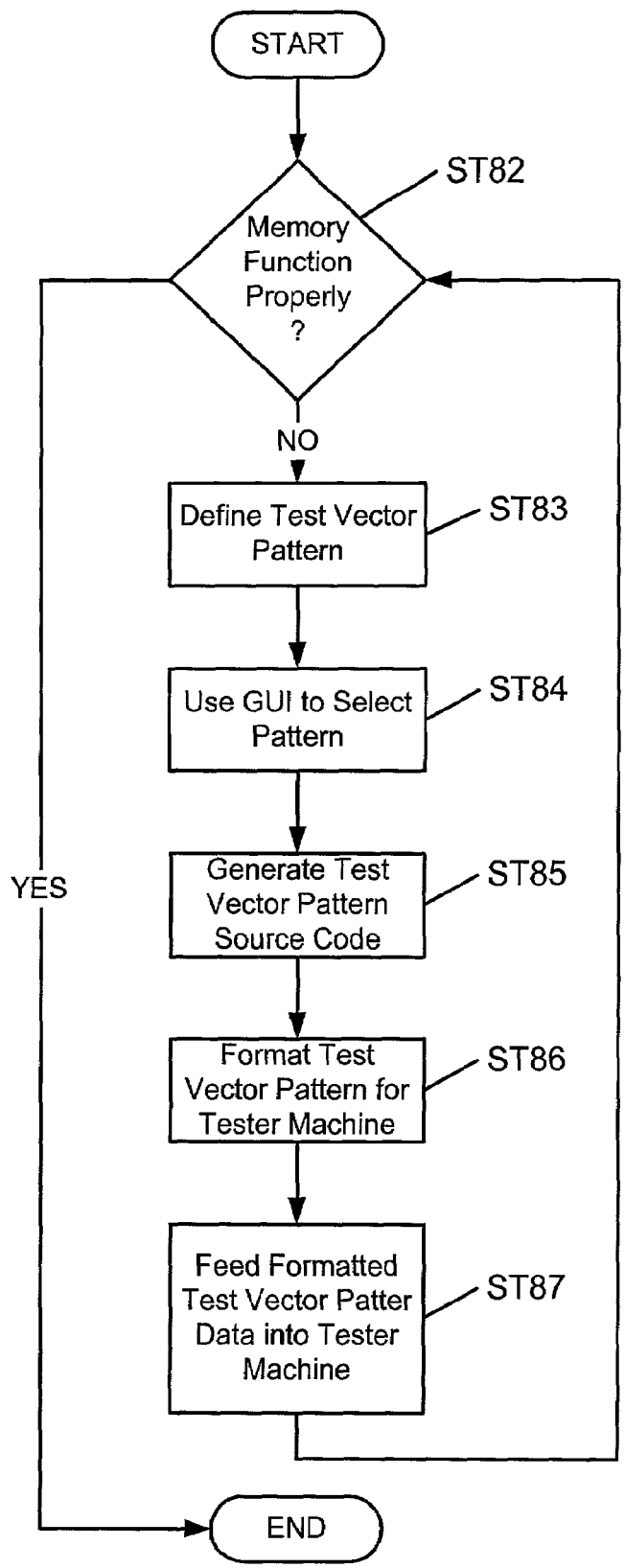
FIG. 5 illustrates a flowchart of a debugging process using a test vector pattern generator in accordance with one or more embodiments of the present invention.

Referring to FIG. 5, the debugging process in which the GUI test pattern tool is utilized begins by testing the array to determine if the array is functioning properly (Step 82). If an array failure occurs, a test vector pattern is defined to assist in debugging the array (Step 83). Next, the GUI tool is used to select the test pattern (Step 84). Following the selection of the test pattern using the GUI tool, source code for a test pattern vector is generated (Step 85). From this point, the test vector pattern is formatted for a particular tester machine (Step 86). The test vector pattern raw data is feed into a tester machine (Step 87). A determination is then made as to whether the array is performing properly (Step 82). If an array works properly, the process ends. If the array fails, the debugging process starts again.

Figure 6:
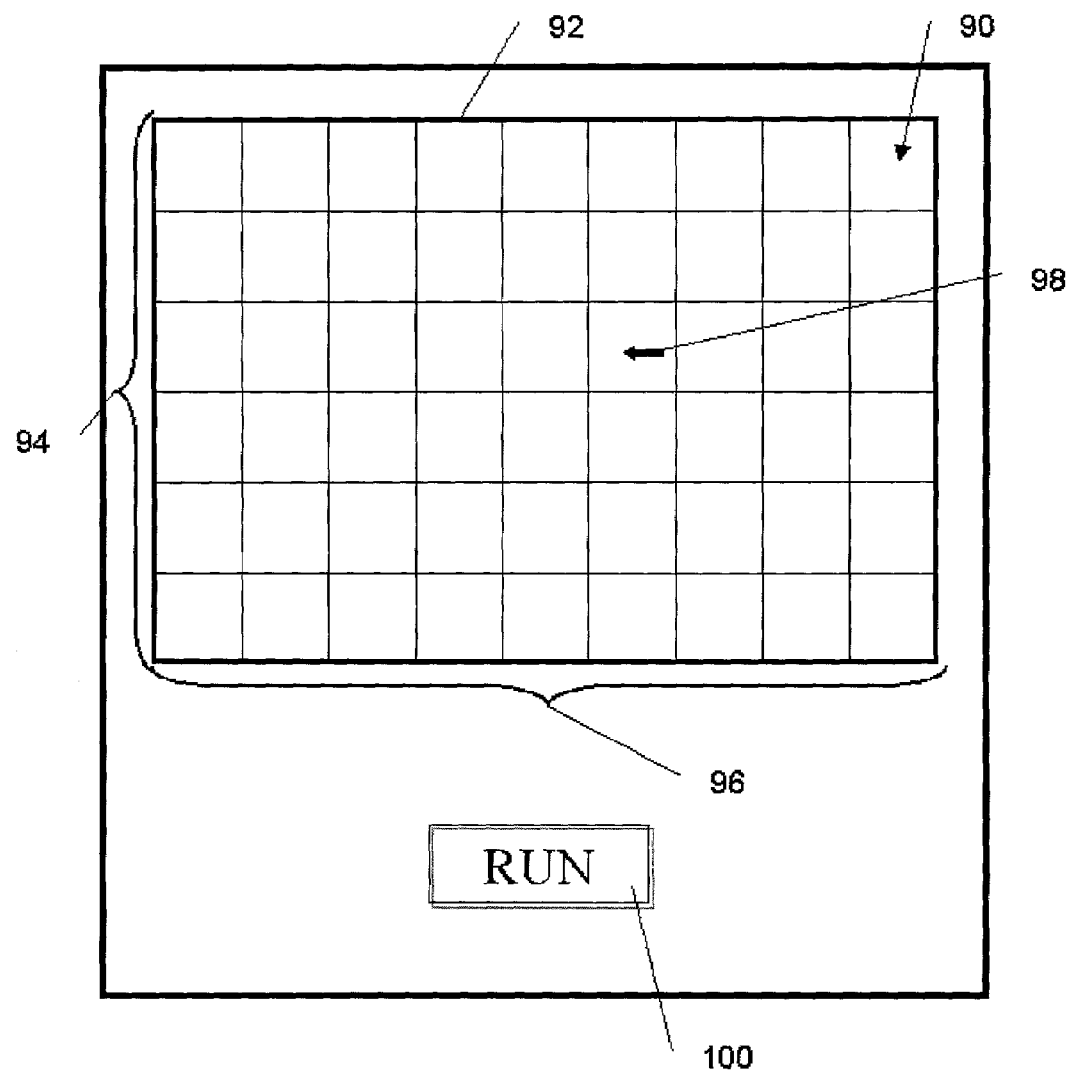
FIG. 6 illustrates an image of the test vector pattern generator in accordance with one or more embodiments of the present invention.

As shown in FIG. 6, in one or more embodiments of the present invention, a graphical user interface of a test pattern vector generator includes a set of square-shaped boxes (90) representing cells arranged in an array (92) with a variable number of rows (94) and columns (96) representative of the array being tested. The graphical user interface (GUI) may not show the entire array, i.e., only a portion of the array may appear in the GUI. The test engineer uses an input device such as a mouse as a pointer (98) to highlight a particular square-shaped box representing a cell within the array. The square-shaped box is highlighted by clicking a button on the input device with the pointer (98) located over the desired square-shaped box. The process of highlighting square-shaped boxes using the input device continues until a desired test vector pattern is displayed on the computer display. Once the desired test vector pattern is displayed, an action button labeled "RUN" (100) is selected and source code is generated to an output file. A sample of a portion of the source code (written in tcl shell script) (104) that is generated to an output file in one or more embodiments of the present invention is shown in FIG. 7.

Figure 8:
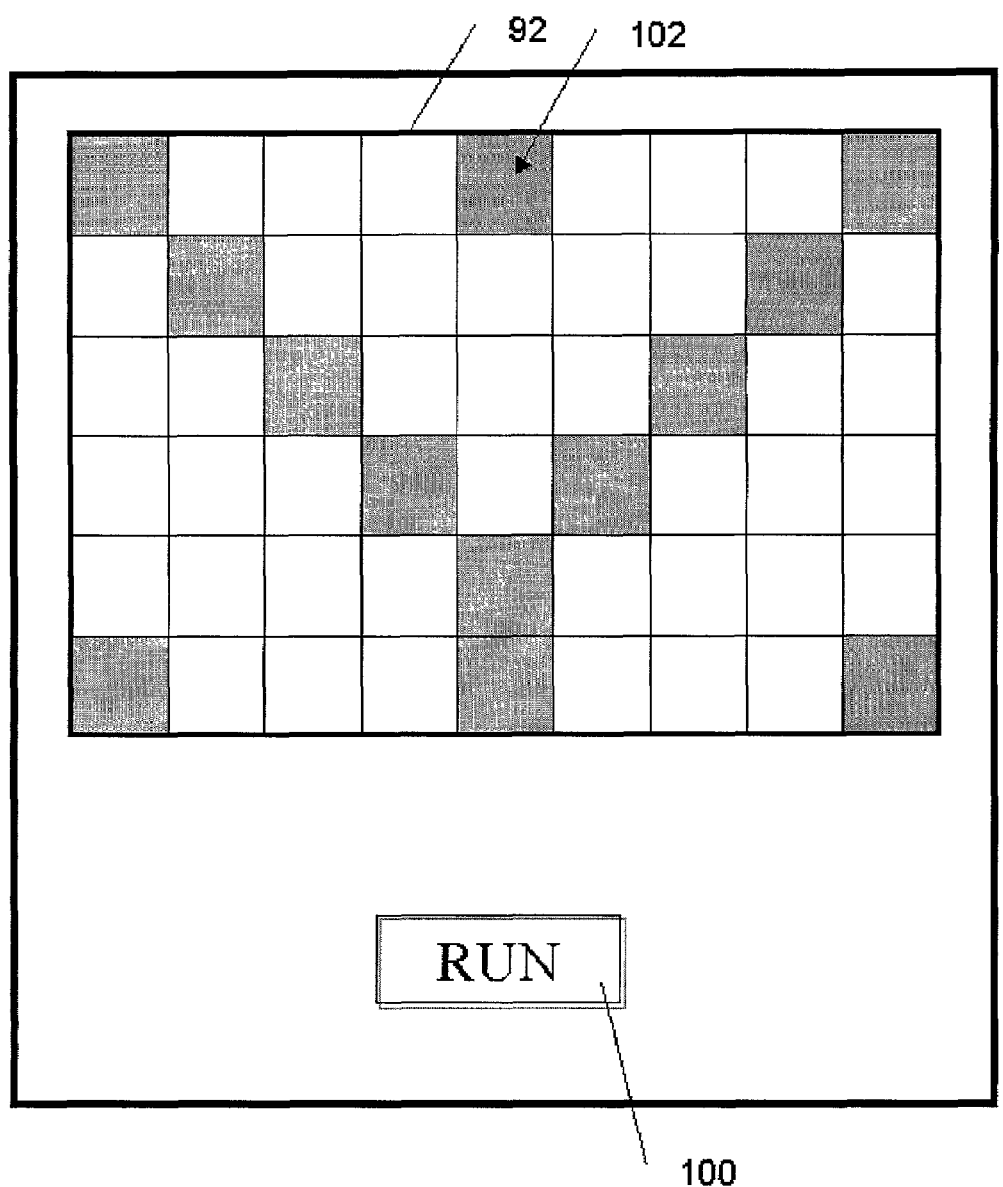
FIG. 8 illustrates an image of the test vector pattern generator showing a random test vector pattern in accordance with one or more embodiments of the present invention.

Depending on the desired test vector pattern chosen by the test engineer, a different set of commands in source code is generated. An example of a random test vector pattern using a graphical user interface is shown in FIG. 8. The array (92) has numerous highlighted cells (102) representing a specific random test vector pattern. When the action button labeled "RUN" (100) is selected, source code representing the specific test vector pattern displayed by the highlighted cells (102) in FIG. 8 is generated to the output file.

In one embodiment of the present invention, the set of commands in source code is generated as a set of write and read operations framed by conditional operations, such as an if . . . then statement, a switch statement, etc. In one or more embodiments of the present invention, the set of commands in source code is generated as a set of write and read operations framed by loop operations, including a do loop statement, a for . . . to statement, etc. In one or more embodiments of the present invention, the source code is written in a programming language such as TCL/TK, C++, etc.

Advantages of the present invention may include one or more of the following. The graphical user interface test vector pattern generator allows a test engineer to generate any conceivable test vector pattern (e.g., systematic, random, and custom) for any size array structure by highlighting the desired pattern using the graphical user interface. The only knowledge necessary for the test vector pattern to be generated is the data the test engineer wants to apply to a particular array. Determining the type and size of the array being tested and the test vector pattern is easily done by viewing the graphical user interface.

Source coding errors by test engineers are virtually eliminated because the source code is automatically generated in a pre-determined, standardized, and error-checked form that is virtually free of errors. Therefore, debugging of source code representing the test vector pattern is not required and the source code is always in an optimized form for increased efficiency. As a result, more time is spent testing arrays for errors. Those skilled in the art will appreciate that the present invention may include other advantages and features.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of generating a test vector pattern for an array, comprising:
   determining a failure of a test of the array;
   defining a type of test vector pattern to generate using a graphical user interface,
      wherein defining the type of test vector pattern to generate using the graphical user interface comprises using the graphical user interface to select at least one of a plurality of cells in the array,
      wherein the graphical user interface displays an image corresponding to the array, wherein the image comprises the plurality of cells, and
      wherein the test vector pattern is defined to debug the array in response to the failure of the test of the array;

generating the test vector pattern using the type of test vector pattern defined using the graphical user interface; and testing the array using the test vector pattern,
wherein generating the test vector pattern comprises converting the test vector pattern into source code.

2. The method of claim 1, further comprising
performing write operations and read operations.

3. The method of claim 2, wherein the write operations and read operations are framed by conditional statements.

4. The method of claim 2, wherein the write operations and read operations are framed by loop statements.

5. The method of claim 1, wherein the array is a memory array.

6. The method of claim 1, wherein the plurality of cells in the image are displayed in a grid comprising a variable number of rows and columns.

7. The method of claim 1, wherein the type of test vector pattern is custom.

8. The method of claim 1, wherein the type of test vector pattern is random.

9. An apparatus for generating a
test vector pattern, comprising:
an array;
a test vector pattern; and
a graphical user interface configured to allow a user to input a type of test vector pattern and configured to generate the test vector pattern, wherein the test vector pattern is defined to debug the array in response to a failure of a test of the array, wherein the user inputs the type of test vector pattern by selecting at least one of a plurality of cells in the array, wherein the graphical user interface displays an image corresponding to the array, and wherein the image comprises the plurality of cells, and
wherein generating the test vector pattern comprises converting the test vector pattern into source code.

10. The apparatus of claim 9, wherein the plurality of cells in the image are displayed in a grid comprising a variable number of rows and columns.

11. The apparatus of claim 9, wherein the type of test vector pattern is custom.

12. The apparatus of claim 9, wherein the type of test vector pattern is random.

13. The apparatus of claim 9, wherein the array is a memory array.

14. The apparatus of claim 9, wherein write operations and read operations are framed by conditional statements.

15. The apparatus of claim 9, wherein the write operations and read operations are framed by loop statements.

16. A computer system to generate a custom test vector pattern for an array, comprising:
a processor;
a memory;
a computer display; and
software instructions stored in memory for enabling the computer system under control of the processor, to perform:

determining a failure of a test of the array;
defining a type of custom test vector pattern to generate,
wherein defining the type of test vector pattern to generate using the graphical user interface comprises using the graphical user interface to select at least one of a plurality of cells in the array,
wherein the graphical user interface displays an image corresponding to the array, wherein the image comprises the plurality of cells, and
wherein the test vector pattern is defined to debug the array in response to the failure of the test of the array;
generating the custom test vector pattern using the type of test vector pattern defined using the graphical user interface;
testing the array using the custom test vector pattern; and
performing write operations and read operations,
wherein generating the custom test vector pattern comprises converting the test vector pattern into source code.

17. The system of claim 16, wherein the plurality of cells in the image are displayed in a grid comprising a variable number of rows and columns.

18. The system of claim 16, wherein write operations and read operations are framed by conditional statements.

19. The system of claim 16, wherein write operations and read operations are framed by loop statements.

20. A test vector pattern generation tool, comprising:
means for determining a failure of a test of the array;
a graphical user interface configured to define a type of custom test vector pattern to generate,
wherein the graphical user interface is configured to define the type of the custom test vector pattern by selecting at least one of a plurality of cells in the array,
wherein the graphical user interface displays an image corresponding to the array, wherein the image comprises the plurality of cells, and
wherein the test vector pattern is defined to debug the array in response to the failure of the test of the array;
means for generating the custom test vector pattern using the type of test vector pattern defined using the graphical user interface;
means for testing the array using the custom test vector pattern;
means for performing write operations and read operations; and
means for generating the custom test vector pattern using a graphical user interface, wherein generating the custom test vector pattern comprises converting the test vector pattern into source code.

* * * * *